United States Patent
Jenkins et al.

(10) Patent No.: US 10,295,589 B2
(45) Date of Patent: May 21, 2019

(54) ELECTROMIGRATION WEAROUT DETECTION CIRCUITS

(71) Applicant: INTERNATIONAL BUSINESS MACHINES CORPORATION, Armonk, NY (US)

(72) Inventors: Keith A. Jenkins, Sleepy Hollow, NY (US); Siyuranga O. Koswatta, Carmel, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 350 days.

(21) Appl. No.: 15/070,577

(22) Filed: Mar. 15, 2016

(65) Prior Publication Data
US 2017/0269152 A1  Sep. 21, 2017

(51) Int. Cl.
| | | |
|---|---|---|
| H02H 1/00 | (2006.01) | |
| G01R 31/28 | (2006.01) | |
| H02H 3/08 | (2006.01) | |

(52) U.S. Cl.
CPC ....... *G01R 31/2858* (2013.01); *H02H 1/0007* (2013.01)

(58) Field of Classification Search
CPC .......... H02H 3/08; H02H 5/083; H02H 3/044; H01L 2924/00; H01L 2924/0002
USPC .......................................................... 361/78
See application file for complete search history.

(56) References Cited

U.S. PATENT DOCUMENTS

| | | |
|---|---|---|
| 6,476,632 B1 | 11/2002 | La Rosa et al. |
| 6,724,214 B2 | 4/2004 | Manna et al. |
| 7,093,213 B2 | 8/2006 | Cohn et al. |
| 8,274,301 B2 | 9/2012 | Feng et al. |
| 8,949,767 B2 | 2/2015 | Bickford et al. |
| 2007/0164768 A1* | 7/2007 | Hsu ................... G01R 31/2858 324/750.3 |
| 2008/0036487 A1 | 2/2008 | Bradley et al. |
| 2009/0132985 A1* | 5/2009 | Hsu ................... G06F 17/5036 716/122 |
| 2014/0181780 A1 | 6/2014 | Burd et al. |
| 2017/0146592 A1 | 5/2017 | Freeman et al. |

* cited by examiner

*Primary Examiner* — Dharti H Patel
(74) *Attorney, Agent, or Firm* — Cantor Colburn LLP; L. Jeffrey Kelly

(57) ABSTRACT

Embodiments include methods, and systems of an integrated circuit having electromigration wearout detection circuits. Integrated circuit may include a detection element and a reference element. Detection element is subject to normal operation current. Reference element is not subject to normal operation current. A resistance of detection element is monitored to detect electromigration wearout. The electromigration wearout detection monitoring circuit may be configured to perform: periodically measuring resistance of detection element, calculating resistance change of detection element over a predetermined time period, comparing resistance change of detection element calculated to a predetermined safety threshold, and take mitigation actions when resistance change of detection element exceeds predetermined safety threshold. The mitigation actions may include switching to a redundant circuit of the integrated circuit, shutting down the integrated circuit, and sending a signal to initiate a service call. The predetermined safety threshold may be 1% of resistance change of the detection element.

20 Claims, 6 Drawing Sheets

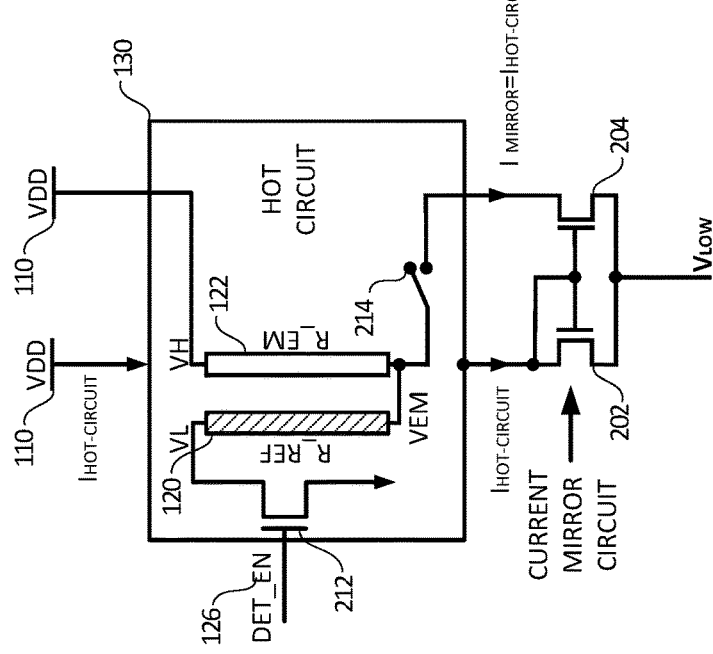

ELECTROMIGRATION WEAROUT DETECTION CIRCUITS

BACKGROUND

The present disclosure relates generally to chip manufacturing, and more particularly to methods and systems of electromigration wearout detection circuits.

With continued density scaling of integrated circuits, heat dissipation of local circuits on chips becomes growingly higher than ever, and normal operation temperature of certain areas of the integrated circuits are running hotter than the ambient temperature, especially for certain high-activity and high-load circuits such as clock buffers, and input/output (I/O) drivers, etc. Conventional on chip temperature measurement (diode sensors) no longer effective for monitoring certain circuit reliability degradation in these critical hot circuits area of the integrated circuit. Specifically, electromigration in metal wires occurs when current is flowing and the wires are hot. Electromigration leads to an increase in resistance and, eventually, to breaks in the wires. It is desirable to monitor actual product circuits themselves, and take certain mitigation actions when the circuit reliability degradation reaches a predetermined safety threshold. Monitoring of electromigration is done by periodically determining if the resistance of current-carrying wires has reached the safety threshold.

Therefore, heretofore unaddressed needs still exist in the art to address the aforementioned deficiencies and inadequacies.

SUMMARY

In one aspect, the present invention relates to an electromigration wearout detection circuit. In certain embodiments, the electromigration wearout detection circuit may include an integrated circuit, and an electromigration wearout detection monitoring circuit. The integrated circuit may include a detection element embedded intrinsically in a hot circuit portion of the integrated circuit, and a reference element positioned extrinsically of the integrated circuit. The detection element may be used to determine a resistance of the detection element under normal operation current, and the reference element may be used to determine a resistance of the reference element not under normal operation current. The measurement of the resistance of the detection element and the resistance of the reference element is switchable via a switching device and a detection enabling signal. The electromigration wearout detection monitoring circuit may be configured to perform: periodically measuring the resistance of the detection element, calculating a resistance change of the detection element over a predetermined time period, comparing the resistance change of the detection element calculated to a predetermined safety threshold, and taking one or more mitigation actions when the resistance change of the detection element exceeds the predetermined safety threshold.

In another aspect, the present invention relates to a method of electromigration wearout detection. In certain embodiments, the method of electromigration wearout detection may include one or more of: embedding a detection element intrinsically in a hot circuit portion of an integrated circuit, and a reference element positioned extrinsically of the integrated circuit, the detection element is subject to normal operation current, and the reference element is not subject to normal operation current, switchable via a switching device and a detection enabling signal, periodically measuring a resistance of the detection element and a resistance of the reference element, using an electromigration wearout detection circuit, calculating a resistance change of the detection element over a predetermined time period, comparing the resistance change of the detection element calculated to a predetermined safety threshold, and taking one or more mitigation actions when the resistance change of the detection element exceeds the predetermined safety threshold.

In yet another aspect, the present invention relates to a method of electromigration wearout detection. In certain embodiments, the method of electromigration wearout detection may include one or more of: embedding a detection element extrinsically in close proximity of a hot circuit portion of an integrated circuit, and a reference element positioned extrinsically of the integrated circuit, the detection element is subject to normal operation current, and the reference element is not subject to normal operation current, switchable via a switching device and a detection enabling signal, periodically measuring a resistance of the detection element and a resistance of the reference element, using an electromigration wearout detection circuit, calculating a resistance change of the detection element over a predetermined time period, comparing the resistance change of the detection element calculated to a predetermined safety threshold, and taking one or more mitigation actions when the resistance change of the detection element exceeds the predetermined safety threshold.

These and other aspects of the present disclosure will become apparent from the following description of the preferred embodiment taken in conjunction with the following drawings and their captions, although variations and modifications therein may be affected without departing from the spirit and scope of the novel concepts of the disclosure.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

FIG. 2A illustrates an electromigration wearout detection circuit using a current mirror circuit to induce a same current in a detection element extrinsically located in close proximity of a critical path of a hot circuit, and FIG. 2B illustrates an electromigration wearout detection circuit using a bias detection separately through a bias resistor according to certain embodiments of the present invention;

DETAILED DESCRIPTION

Figure 1A:
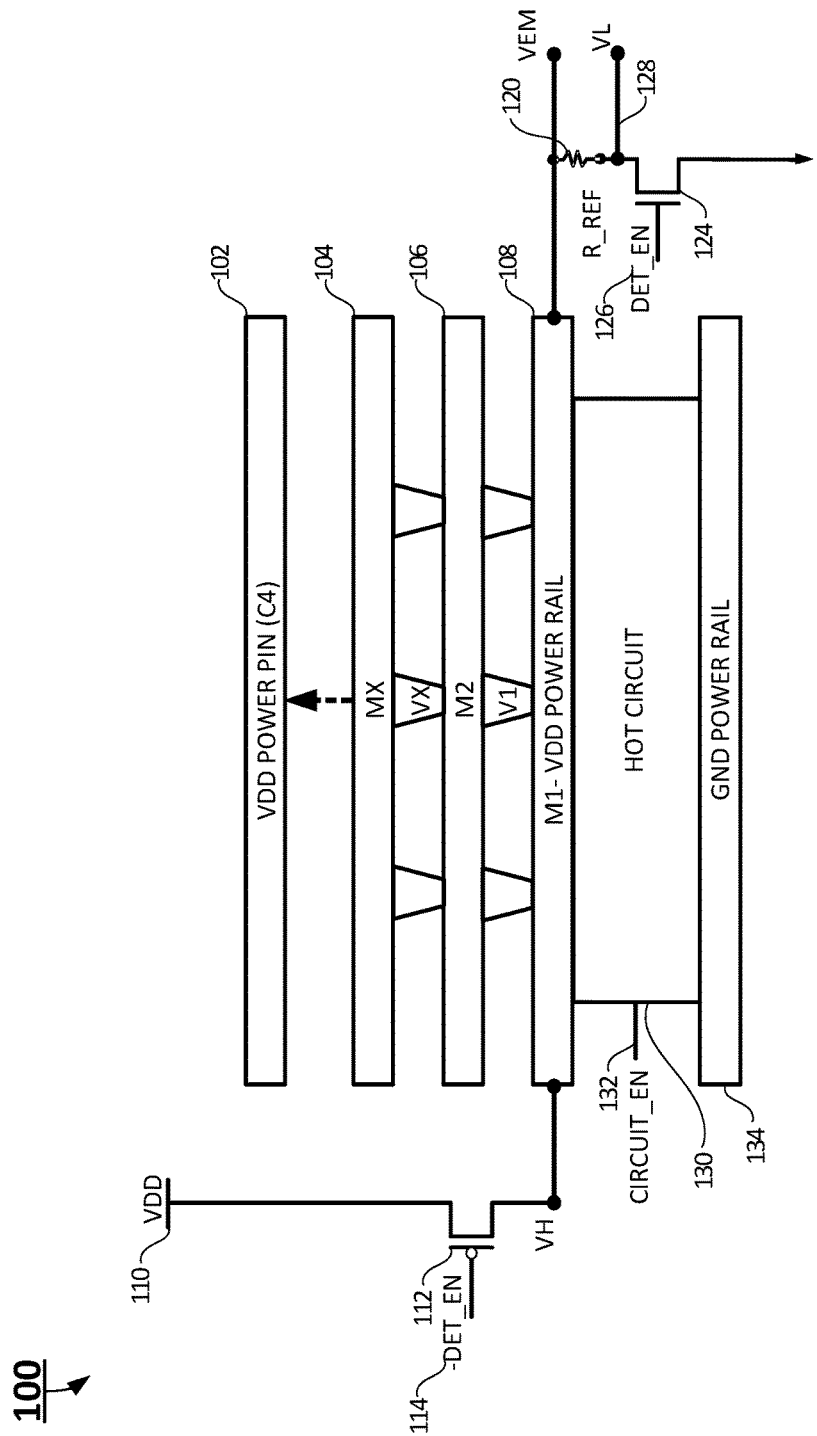
FIG. 1A illustrates a portion of an integrated circuit having a VDD power rail as an electromigration wearout detection element.

The present disclosure is more particularly described in the following examples that are intended as illustrative only since numerous modifications and variations therein will be apparent to those skilled in the art. Various embodiments of the disclosure are now described in detail. Referring to the drawings, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present disclosure. Additionally, some terms used in this specification are more specifically defined below.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. It will be appreciated that same thing can be said in more than one way. Consequently, alternative language and synonyms may be used for any one or more of the terms discussed herein, nor is any special significance to be placed upon whether or not a term is elaborated or discussed herein. The use of examples anywhere in this specification including examples of any terms discussed herein is illustrative only, and in no way limits the scope and meaning of the disclosure or of any exemplified term. Likewise, the disclosure is not limited to various embodiments given in this specification.

Unless otherwise defined, all technical and scientific terms used herein have the same meaning as commonly understood by one of ordinary skill in the art to which this disclosure pertains. In the case of conflict, the present document, including definitions will control.

As used herein, "plurality" means two or more. The terms "comprising," "including," "carrying," "having," "containing," "involving," and the like are to be understood to be open-ended, i.e., to mean including but not limited to.

The term "FET" stands for field-effect transistor. The FET may include n-channel FET, p-channel FET, metal-oxide-semiconductor field-effect transistor (MOSFET), dual-gate MOSFET (DGMOSFET), insulated-gate bipolar transistor (IGBT) etc.

The present disclosure will now be described more fully hereinafter with reference to the accompanying drawings FIGS. 1-5, in which certain exemplary embodiments of the present disclosure are shown. The present disclosure may, however, be embodied in many different forms and should not be construed as limited to the embodiments set forth herein; rather, these embodiments are provided so that this disclosure will be thorough and complete, and will fully convey the scope of the disclosure to those skilled in the art.

Referring now to FIG. 1A, a portion of an integrated circuit 100 having a VDD power rail as an electromigration wearout detection element is shown according to one embodiment of the present invention. The integrated circuit 100 may include a hot circuit 130, a ground power rail 134, a first metal layer M1-VDD power rail 108, a second metal layer M2 106, a x-th metal layer Mx 104, and a VDD power pin C4 102. The VDD power pin C4 102 may be connected to a VDD power supply 110. A number of vias $V_1$ are located between the first metal layer M1-VDD power rail 108 and the second metal layer M2 106 to electrically couple the first metal layer M1-VDD power rail 108 to the metal layer M2 106. A number of vias Vx are located between the second metal layer M2 106 and the x-th metal layer Mx 104 to electrically couple the second metal layer M2 106 to the x-th metal layer Mx 104. In this embodiment, the first metal layer M1-VDD power rail 108 forms a detection element 122, therefore, the resistance of the detection element 122 is the resistance between a left end of the first metal layer M1-VDD power rail 108 and a right end of the first metal layer M1-VDD power rail 108. The detection element 122 is embedded intrinsically in the hot circuit 130 portion of the integrate circuit 100, and a reference element 120 positioned extrinsically of the integrate circuit 100. The detection element 122 may be used to determine the resistance of the detection element 122 under normal operation current.

In certain embodiments, the electromigration wearout detection circuit may include an electromigration wearout detection control circuit configured to provide a detection enabling signal DET_EN 126 to turn on a detection mode to measure a resistance change of the detection element 122. The integrated circuit 100 may also include a circuit enabling signal CIRCUIT_EN 132 to the hot circuit 130. In one embodiment, when the circuit enabling signal CIRCUIT_EN 132 is rising from 0 to 1, the hot circuit 130 is operating normally, and when the circuit enabling signal CIRCUIT_EN 132 is falling from 1 to 0, the hot circuit 130 is shut down.

During the detection mode, the detection enabling signal DET_EN is 1, and the hot circuit enabling signal CIRCUIT_EN is 0, therefore, the hot circuit 130 is turned off, and the resistance of the detection element 122 may be measured.

The integrated circuit 100 may include a first switching device 112, and a second switching device 124. The first switching device 112 may receive a negative DET_EN signal 114, and the second switching device 124 may receive a positive DET_EN signal 126. When the first switching device 112 receives the negative DET_EN signal 114 (falling from 1 to 0), the first switching device 112 turns on and the VDD 110 is directly electrically coupled to the first metal layer M1-VDD power rail 108 forming a high voltage VH at a source terminal of the first switching device 112. When the second switching device 124 receives the positive DET_EN signal 126 (raising from 0 to 1), the second switching device 124 turns on a detection mode, and an output voltage VEM is formed at the right end of the first metal layer M1-VDD power rail 108. A low voltage is formed at a drain terminal of the second switching device 124. These three voltages VH, VEM, and VL may be measured during the detection mode, and the resistance of the detection element 122 may be calculated by a formula:

$$\frac{R\_EM}{R\_REF} = \frac{VH - VEM}{VEM - VL}$$

where R_EM is the resistance of the detection element 122, and R_REF is the resistance of the reference element 120. During the detection mode of the circuit in FIG. 1A, power supply voltage will not be applied to the VDD Power Pin (C4) 102, and thus current will not flow from the VDD power pin C4 102 down to the circuit level. In this case current will only flow from VDD 110 through switch 112, and further through the left end of the first metal layer M1-VDD power rail 108 to the right end of the first metal layer M1-VDD power rail 108, and finally to ground through the second switching device 124.

In certain embodiments, when the circuit enabling signal CIRCUIT_EN 132, the positive DET_EN signal, and the negative DET_EN signal may be used synchronously. When the circuit enabling signal CIRCUIT_EN 132 is rising from 0 to 1, the negative DET_EN signal 114 is rising from 0 to 1, and the positive DET_EN signal 126 is falling from 1 to 0, the hot circuit 130 operates normally. When the circuit enabling signal CIRCUIT_EN 132 is falling from 1 to 0, the negative DET_EN signal 114 is falling from 1 to 0, the positive DET_EN signal 126 is rising from 0 to 1, and the VDD Power Pin (C4) 102 is disconnected from the power supply, the hot circuit 130 is shut down, and the resistance of the detection element 122 and the reference element 120 may be measured at this time.

Figure 1B:
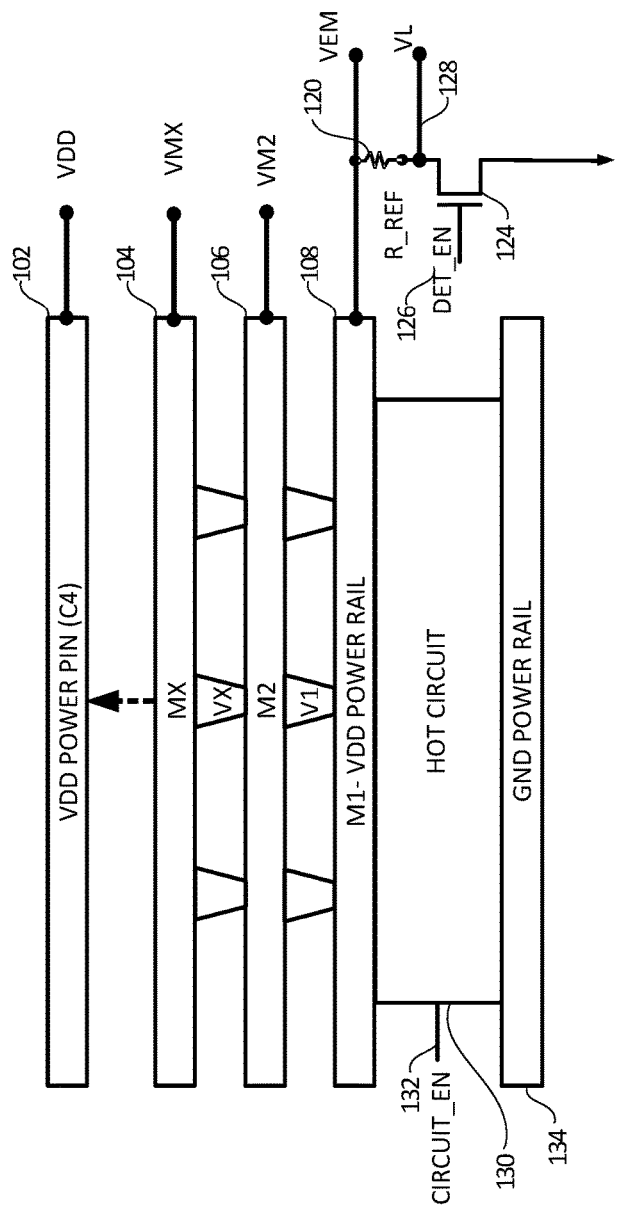
FIG. 1B illustrates a portion of an integrated circuit having conducting wires and vias as an electromigration wearout detection element, according to one embodiment of the present invention.

Referring now to FIG. 1B, a portion of an integrated circuit 101 having conducting wires and vias as an electromigration wearout detection element is shown according to one embodiment of the present invention. The integrated circuit 100 may include a hot circuit 130, a ground power rail 134, a first metal layer M1-VDD power rail 108, a second metal layer M2 106, a x-th metal layer Mx 104, and a VDD power pin C4 102. The VDD power pin C4 102 may be connected to a VDD power supply 110. A number of vias $V_1$ are located between the first metal layer M1-VDD power rail 108 and the second metal layer M2 106 to electrically couple the first metal layer M1-VDD power rail 108 to the metal layer M2 106. A number of vias Vx are located between the second metal layer M2 106 and the x-th metal layer Mx 104 to electrically couple the second metal layer M2 106 to the x-th metal layer Mx 104.

In certain embodiments, the integrated circuit 101 may include a second switching device 124. When the second switching device 124 receives the positive DET_EN signal 126 (raising from 0 to 1), the second switching device 124 turns on a detection mode, and an output voltage VEM is formed at the right end of the first metal layer M1-VDD power rail 108. A low voltage is formed at a drain terminal of the second switching device 124. Furthermore, during the detection mode, the hot circuit enabling signal CIRCUIT_EN is 0, therefore, the hot circuit 130 is turned off.

In one embodiment, a power supply VDD is applied to the VDD power pin C4 102, and further applied to the hot circuit 130 through the x-th metal layer Mx 104, the second metal layer M2 106, and the first metal layer M1-VDD power rail 108, and all vias between the x-th metal layer Mx 104, the second metal layer M2 106, and the first metal layer M1-VDD power rail 108.

In one embodiment, a voltage at the second metal layer M2 106 VM2 is designated as a high voltage VH. In this case, a detection element 122 is formed through the second metal layer M2 106, the vias V1 between the second metal layer M2 106 and the first metal layer M1-VDD power rail 108, and the first metal layer M1-VDD power rail 108.

In another embodiment, a voltage at the x-th metal layer Mx 104 VMX is designated as a high voltage VH. In this case, a detection element 122 is formed through the x-th metal layer Mx 104, the vias Vx between the x-th metal layer Mx 104 and the second metal layer M2 106, the second metal layer M2 106, the vias V1 between the second metal layer M2 106 and the first metal layer M1-VDD power rail 108, and the first metal layer M1-VDD power rail 108.

In yet another embodiment, a voltage at the VDD Power Pin (C4) 102 is designated as a high voltage VH. In this case, a detection element 122 is formed through the VDD Power Pin (C4) 102, any vias or conducting wires between the VDD Power Pin (C4) 102 and the x-th metal layer Mx 104, the vias Vx between the x-th metal layer MX 104 and the second metal layer M2 106, the second metal layer M2 106, the vias V1 between the second metal layer M2 106 and the first metal layer M1-VDD power rail 108, and the first metal layer M1-VDD power rail 108.

All these voltages VH, VEM, and VL may be measured during the detection mode, and the resistance of the detection element 122 may be calculated by a formula:

$$\frac{R\_EM}{R\_REF} = \frac{VH - VEM}{VEM - VL}$$

where R_EM is the resistance of the detection element 122, and R_REF is the resistance of the reference element 120.

In certain embodiments, the detection elements 122 may be placed extrinsically to the hot circuit 130.

Referring now to FIG. 2A, an electromigration wearout detection circuit 200 using a current mirror circuit to induce a same current in the detection element extrinsically located in close proximity of a critical path of the hot circuit 130 is shown according to certain exemplary embodiments of the present invention. The electromigration wearout detection circuit 200 may include a current mirror circuit to induce the same current in the detection element R_EM extrinsically located in close proximity of the critical path of the hot circuit 130. The current mirror circuit may include a first FET 202 to generate a hot circuit current $I_{HOT\_CIRCUIT}$, and a second FET 204 to generate a mirror current $I_{MIRROR}$, which is the same as $I_{HOT\_CIRCUIT}$.

The electromigration wearout detection circuit 200 may include a switching device 212, and another switch 214. During normal operation, the switch 214 is closed, and the switching device 212 is open. A gate of the switching device 212 may receive a detection enabling signal DET_EN 126. When the gate of the switching device 212 receives the detection enabling signal DET_EN 126, the electromigration wearout detection circuit 200 is placed in a detection mode. During the detection mode, the switch 214 is open, and there are three voltages in the electromigration wearout detection circuit 200: a high voltage VH at a first terminal of the detection element 122, an output voltage VEM at a second terminal of the detection element 122 and a first terminal of the reference element 120, and a low voltage at a second terminal of the reference element 120. During the detection mode, these voltages VH, VEM, and VL are measured, and the resistance change of the detection element 122 is calculated by a formula:

$$\frac{R\_EM}{R\_REF} = \frac{VH - VEM}{VEM - VL}$$

where R_EM is the resistance of the detection element 122, and R_REF is the resistance of the reference element 120.

Referring now to FIG. 2B, an electromigration wearout detection circuit 201 using a bias detection separately through a bias resistor R_BIAS 206 is shown according to certain embodiments of the present invention. The electromigration wearout detection circuit 201 may include the bias resistor R_BIAS 206 connected in series with the detection element R_EM 122.

The electromigration wearout detection circuit 201 may include a switching device 222, and another switch 224. During normal operation, the switch 224 is closed, and the switching device 222 is open. A gate of the switching device 222 may receive a detection enabling signal DET_EN 126. When the gate of the switching device 222 receives the detection enabling signal DET_EN 126, the electromigration wearout detection circuit 201 is placed in a detection mode. During the detection mode, the switch 224 is open, and there are three voltages in the electromigration wearout detection circuit 201: a high voltage VH at a first terminal of the detection element 122, an output voltage VEM at a second terminal of the detection element 122 and a first terminal of the reference element 120, and a low voltage at a second terminal of the reference element 120. During the detection mode, these voltages VH, VEM, and VL are measured, and the resistance change of the detection element 122 is calculated by a formula:

$$\frac{R\_EM}{R\_REF} = \frac{VH - VEM}{VEM - VL}$$

where R_EM is the resistance of the detection element 122, and R_REF is the resistance of the reference element 120.

Figure 3:
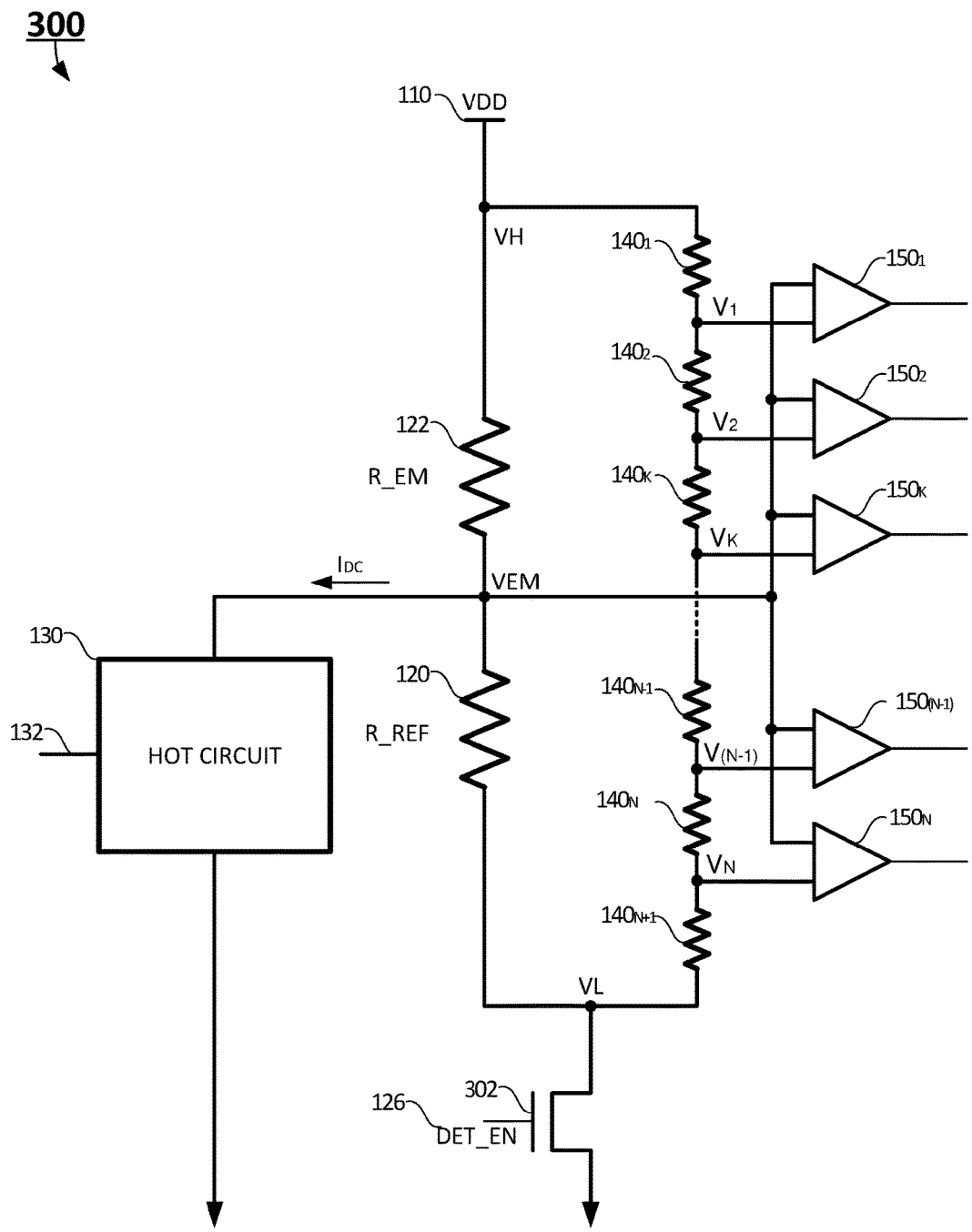
FIG. 3 is a circuit diagram of an electromigration wearout detection monitoring circuit having a voltage divider detection monitoring circuit according to one embodiment of the present invention.

In certain embodiments, an electromigration wearout detection circuit may also include an electromigration wearout detection monitoring circuit. Referring now to FIG. 3, a circuit diagram of an electromigration wearout detection monitoring circuit 300 having a voltage divider detection monitoring circuit is shown according to one embodiment of the present invention. The voltage divider detection monitoring circuit may include a voltage detection circuit, (N+1) voltage divider resistors $140_1$, $140_2$, ..., and $140_{N+1}$, where N being a positive integer, N voltage comparators $150_1$, $150_2$, ..., and $150_N$, and a switching device 302.

In certain embodiments, the hot circuit 130 may include a hot circuit enabling signal input 132. When the hot circuit enabling signal input 132 receives a CIRCUIT_EN signal (CIRCUIT_EN=1), the hot circuit 130 works normally. Furthermore, during normal operation the switching device 302 is open. When the hot circuit enabling signal input 132 receives a negative CIRCUIT_EN signal (CIRCUIT_EN=0), the hot circuit 130 is shut down and a hot circuit current $I_{DC}$ as shown in FIG. 3 becomes 0. During the detection mode, the hot circuit 130 is shut down and the $I_{DC}$ is 0.

The voltage detection circuit may include the detection element 122 and the reference element 120. Each of the detection element 122 and the reference element 120 has a first terminal and a second terminal. The first terminal of the detection element 122 may be electrically coupled to a high voltage VH of the voltage detection circuit, the second terminal of the detection element 122 is electrically coupled to the first terminal of the reference element 120 to form an output voltage VEM of the voltage detection circuit, and the second terminal of the reference element 120 may be electrically coupled to a low voltage VL of the voltage detection circuit.

The (N+1) voltage divider resistors $140_1$, $140_2$, ..., and $140_{N+1}$, each having a first terminal and a second terminal, may be electrically coupled in series. The first terminal of the first voltage divider resistor $140_1$ is electrically coupled to the high voltage VH, each of the second terminal of a k-th voltage divider resistor $140_k$ (where k=2, 3, ..., N) is electrically coupled to the first terminal of a next (k+1)-th voltage divider resistor $140_{k+1}$ to form an output terminal of the k-th voltage divider resistor $140_k$, and the second terminal of a last (N+1)-th voltage divider resistor $140_{N+1}$ is electrically coupled to the low voltage VL.

In certain embodiments, each of the N voltage comparators $150_1$, $150_2$, ..., and $150_N$, has a first input terminal, a second input terminal, and an output terminal. Each of the N voltage comparators $150k$ (k=1, 2, ..., N, where N is a positive integer) corresponds to each of the first N voltage divider resistors $140k$. Each of a first terminal of the k-th voltage comparator $150_k$ is electrically coupled to the output terminal of the k-th voltage divider resistor $140_k$. Each of a second terminal of the k-th voltage comparator $150k$ is electrically coupled to the output voltage VEM of the voltage detection circuit. The output of the k-th voltage comparator $150k$ is 1 when a voltage Vk at the input terminal of the k-th voltage comparator $150k$ is less than the output voltage VEM of the voltage detection circuit. The output of the k-th voltage comparator $150k$ is 0 when the voltage Vk at the input terminal of the k-th voltage comparator $150k$ is greater than the output voltage VEM of the voltage detection circuit. The resistance of the detection element 122 is calculated by a formula:

$$\frac{R\_EM}{R\_REF} = \frac{m}{N-m},$$

where m is the total number of voltage comparators that have an output value of one, and N is the total number of voltage comparators.

In certain embodiments, the switching device 302 may be a field-effect transistor (FET). A gate terminal of the FET is electrically coupled to a detection enabling signal source, a source terminal of the FET is electrically coupled to a ground, and a drain terminal of the FET is electrically coupled to the second terminal of the voltage divider detection monitoring circuit. The switching device 302 is configured to turn on electromigration wearout detection when the gate of the FET receives a detection enabling signal.

Figure 4:
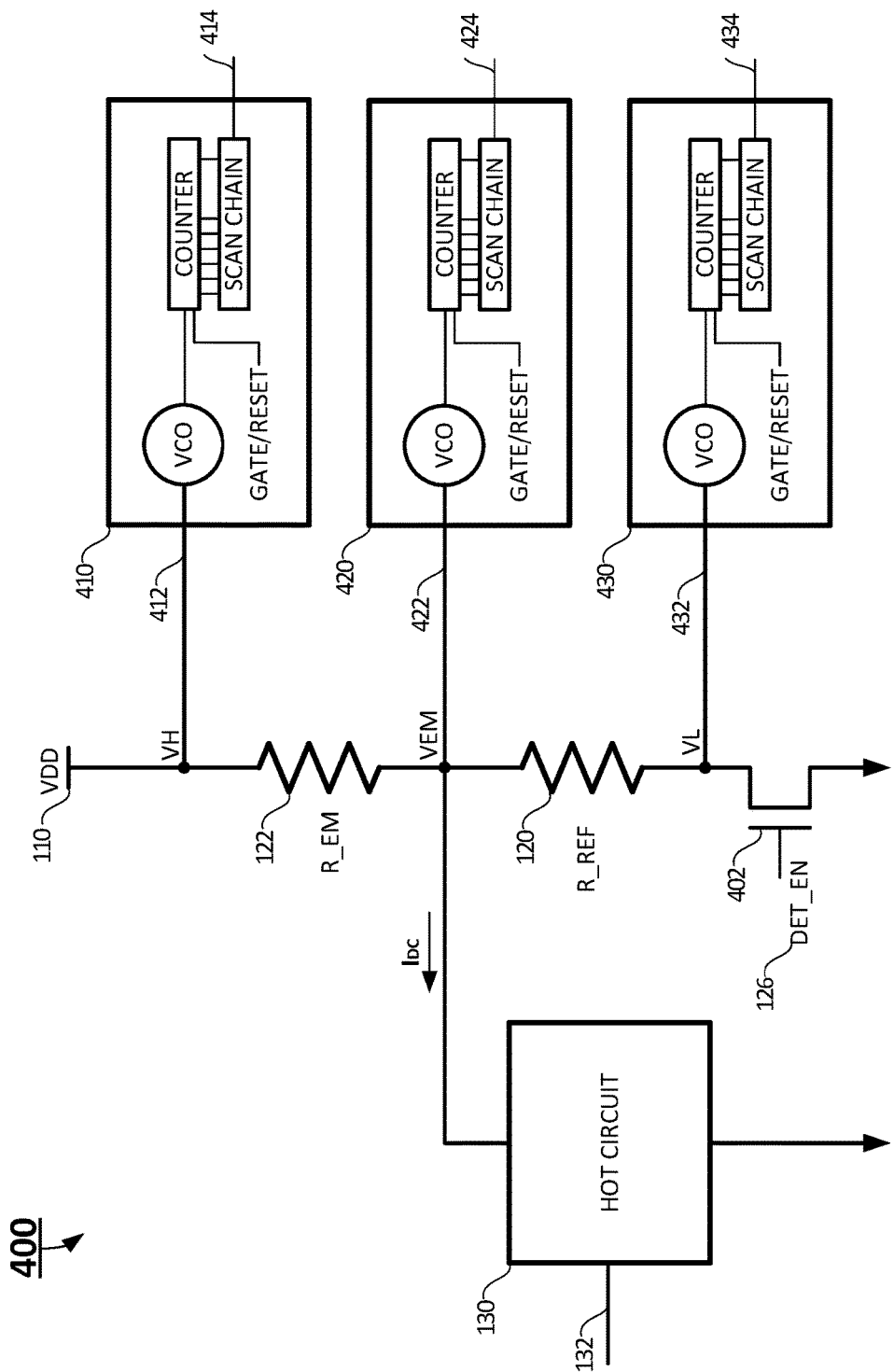
FIG. 4 is a circuit diagram of an electromigration wearout detection monitoring circuit having a voltage controlled oscillation (VCO) detection monitoring circuit according to another embodiment of the present invention.

Referring now to FIG. 4, a circuit diagram of an electromigration wearout detection monitoring circuit 400 having a voltage controlled oscillator (VCO) detection monitoring circuit is shown according to another embodiment of the present invention. The VCO detection monitoring circuit may include a voltage detection circuit, a first VCO voltage detection circuit 410, a second VCO voltage detection circuit 420, a third VCO voltage detection circuit 430, and a switching device 402.

The voltage detection circuit may include the detection element 122 and the reference element 120. The first terminal of the detection element 122 may be electrically coupled to a high voltage VH of the voltage detection circuit, the second terminal of the detection element 122 is electrically coupled to the first terminal of the reference element 120 to form an output voltage VEM of the voltage detection circuit, and the second terminal of the reference element 120 forms a low voltage VL of the voltage detection circuit.

In certain embodiments, the hot circuit 130 may include a hot circuit enabling signal input 132. When the hot circuit enabling signal input 132 receives a CIRCUIT_EN signal (CIRCUIT_EN=1), the hot circuit 130 works normally.

Furthermore, during normal operation the switching device 402 is open. When the hot circuit enabling signal input 132 receives a negative CIRCUIT_EN signal (CIRCUIT_EN=0), the hot circuit 130 is shut down and a hot circuit current $I_{DC}$ as shown in FIG. 4 becomes 0. During the detection mode, the hot circuit 130 is shut down and the $I_{DC}$ is 0.

The first VCO voltage detection circuit 410 has an input terminal 412 electrically coupled to the high voltage VH of the voltage detection circuit to measure the high voltage VH of the voltage detection circuit, and an output terminal 414 configured to provide the high voltage VH measured. The second VCO voltage detection circuit 420 has an input terminal 422 electrically coupled to the output voltage VEM of the voltage detection circuit to measure the output voltage VEM of the voltage detection circuit, and an output terminal 424 configured to provide the output voltage VEM measured. The third VCO voltage detection circuit 430 has an input terminal 432 electrically coupled to the low voltage VL of the voltage detection circuit to measure the low voltage VL of the voltage detection circuit, and an output terminal 434 configured to provide the low voltage VL measured. The voltage is measured by determining the frequency of the VCO using the gated counters in 410, 420 and 430.

In certain embodiments, the switching device 402 may be a field-effect transistor (FET). A gate terminal of the FET is electrically coupled to a detection enabling signal source, a source terminal of the FET is electrically coupled to a ground, and a drain terminal of the FET is electrically coupled to the second terminal of the voltage divider detection monitoring circuit. The switching device 402 is configured to turn on electromigration wearout detection when the gate of the FET receives a detection enabling signal. The resistance of the detection element 122 is calculated by a formula:

$$\frac{R\_EM}{R\_REF} = \frac{VH - VEM}{VEM - VL}$$

where R_EM is the resistance of the detection element 122, and R_REF is the resistance of the reference element 120.

Figure 5:
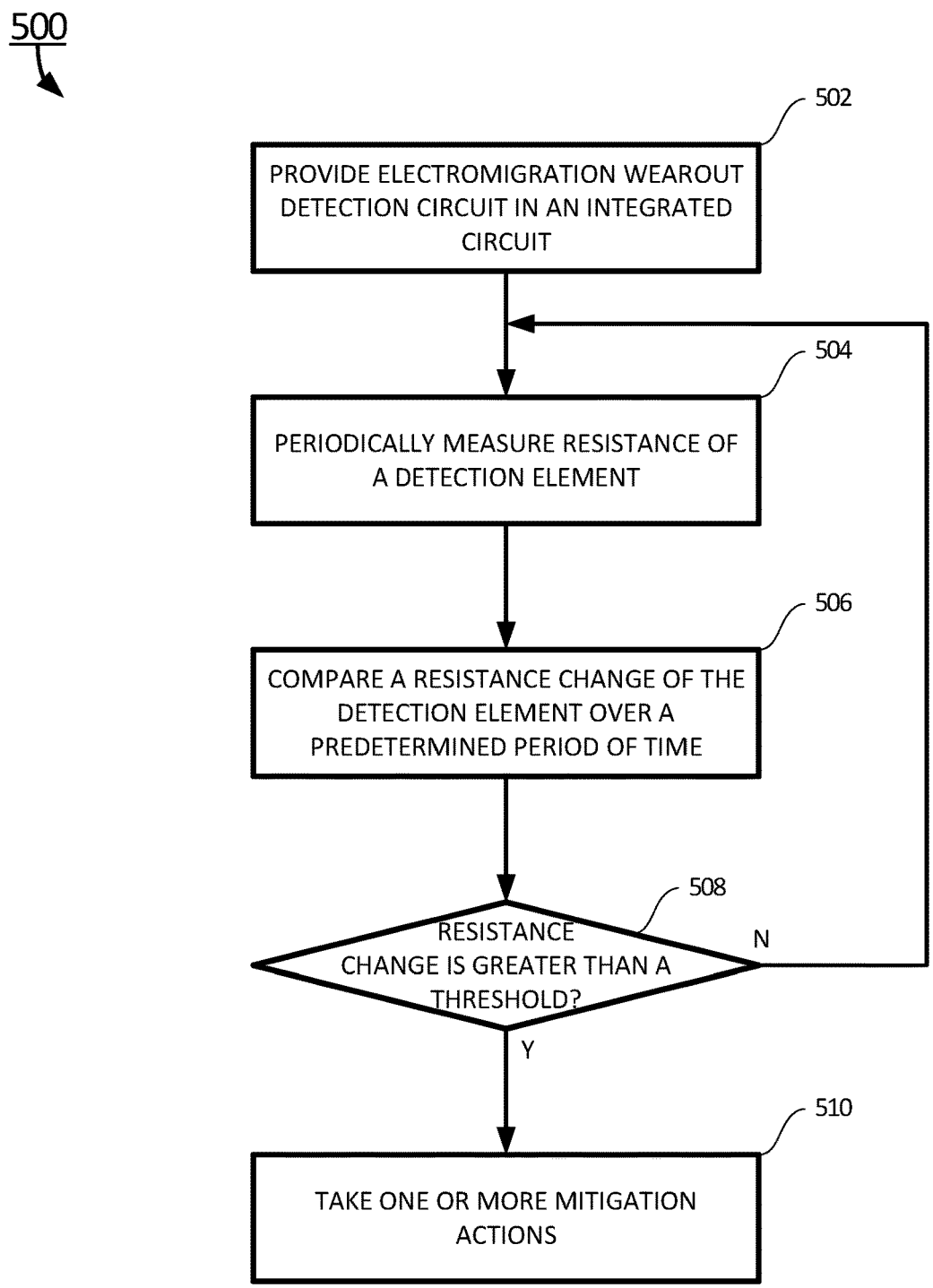
FIG. 5 shows a flow chart of a method of electromigration wearout detection according to certain embodiments of the present invention.

In another aspect, the present invention relates to a method of electromigration wearout detection. Referring now to FIG. 5, a flow chart of a method 500 of an electromigration wearout detection according to certain embodiments of the present invention.

At block 502, the method includes providing an electromigration wearout detection circuit in an integrated circuit 100. In one embodiment, the electromigration wearout detection circuit may include a detection element 122 intrinsically embedded in a hot circuit 130 portion of the integrated circuit 100, and a reference element 120 positioned extrinsically of the integrated circuit 100. In another embodiment, the electromigration wearout detection circuit may include a detection element 122 extrinsically placed in close proximity of the hot circuit 130 portion of the integrated circuit 100, and a reference element 120 positioned extrinsically of the integrated circuit 100. The detection element 122 is subject to normal operation current, and the reference element 120 is not subject to normal operation current, switchable via a switching device and a detection enabling signal.

At block 504, the electromigration wearout detection circuit may periodically measure a resistance of the detection element 122 and a resistance of the reference element 120. Since the reference element 120 is not subject to normal operation current, the resistance of the reference element 120 may remain constant. The detection element 122 is subject to normal operation current, and when the hot circuit 130 becomes hot, the resistance of the detection element 122 may change over a period of time, indicating certain degree of electromigration wearout.

At block 506, the electromigration wearout detection circuit may monitor a resistance change of the detection element 122 over a predetermined period of time. In one embodiment, the electromigration wearout detection circuit compares the measured current resistance of the detection element 122 with the initial resistance of the detection element 122 every one minute. In another embodiment, the electromigration wearout detection circuit compares the measured current resistance of the detection element 122 with the resistance of the detection element 122 every 10 minute. The predetermined period of time may include every hour, or every day, depending on specific application of the integrated circuit.

At query block 508, the electromigration wearout detection circuit may compare the monitored resistance change of the detection element 122 with a predetermined safety threshold. When the monitored resistance change of the detection element 122 is less than the predetermined safety threshold, the method proceeds to block 504 to continue monitoring the resistance of the detection element 122. When the monitored resistance change of the detection element 122 is greater than the predetermined safety threshold, the method proceeds to block 510.

In one embodiment, the predetermined safety threshold may be 1% of resistance change of the detection element 122. In another embodiment, the predetermined safety threshold may be 10% of resistance change of the detection element 122. In yet another embodiment, the predetermined safety threshold may be between 1% and 10% of the resistance change of the detection element 122 depending on specific hot circuit 130 monitored.

At block 510, when the electromigration wearout detection circuit detects electromigration wearout of the detection element 122, the electromigration wearout detection circuit sends instructions to the integrated circuit 100 to take one or more mitigation actions. In certain embodiments, the one or more mitigation actions may include: switching to a redundant circuit of the integrated circuit 100, shutting down the integrated circuit 100, or send a signal in order to initiate a system service call.

Aspects of the present invention are described herein with reference to flowchart illustrations and/or block diagrams of methods according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electromigration wearout detection circuit comprising:
    an integrated circuit having a detection element subject to normal operation current embedded intrinsically in a hot circuit portion of the integrated circuit, and a reference element not subject to normal operation current, switchable via a switching device and a detection enabling signal; and
    an electromigration wearout detection monitoring circuit configured to perform:
        measuring, periodically, a resistance of the detection element;
        calculating a resistance change of the detection element over a predetermined time period;
        comparing the resistance change of the detection element calculated to a predetermined safety threshold; and
        taking one or more mitigation actions when the resistance change of the detection element exceeds the predetermined safety threshold.

2. The electromigration wearout detection circuit of claim 1, wherein the detection element comprises:
    a metal wire;
    a via; and
    a combination thereof.

3. The electromigration wearout detection circuit of claim 1, wherein the reference element comprises:
    a metal wire;
    a via;
    a resistor; and
    a combination thereof.

4. The electromigration wearout detection circuit of claim 1, wherein one or more mitigation actions comprise:
    switching to a redundant circuit of the integrated circuit;
    shutting down the integrated circuit; and
    sending a signal in order to initiate a system service call.

5. The electromigration wearout detection circuit of claim 1, wherein the predetermined safety threshold is 1% of resistance change of the detection element.

6. The electromigration wearout detection circuit of claim 1 further comprising an electromigration wearout detection control circuit configured to provide the detection enabling signal to measure the resistance of the detection element, and the resistance of the reference element.

7. The electromigration wearout detection circuit of claim 1, wherein the electromigration wearout detection monitoring circuit comprises a voltage divider detection monitoring circuit having:
    a voltage detection circuit comprising the detection element having a first terminal and a second terminal, and the reference element having a first terminal and a second terminal, wherein the first terminal of the detection element forms a high voltage VH of the voltage detection circuit, the second terminal of the detection element is electrically coupled to the first terminal of the reference element to form an output voltage VEM of the voltage detection circuit, and the second terminal of the reference element forms a low voltage VL of the voltage detection circuit;
    a plurality (N+1) of voltage divider resistors, where N being a positive integer, electrically coupled in series, each having a first terminal and a second terminal, wherein the first terminal of a first voltage divider resistor is electrically coupled to the high voltage VH, each of the second terminal of a k-th voltage divider resistor (where k=1, 2, ..., N, N being a positive integer) is electrically coupled to the first terminal of a next (k+1)-th voltage divider resistor to form an output terminal of the k-th voltage divider resistor, and the second terminal of a last (N+1)-th voltage divider resistor is electrically coupled to the low voltage VL;
    a plurality (N) of voltage comparators, each of the N voltage comparators corresponding to each of the first N voltage divider resistors and each of the plurality of voltage comparators having a first input terminal, a second input terminal, and an output terminal, wherein each of a first terminal of a k-th voltage comparator is electrically coupled to the output terminal of the k-th voltage divider resistor, each of a second terminal of the k-th voltage comparator is electrically coupled to the output voltage VEM of the voltage detection circuit; and
    a switching device having a gate terminal electrically coupled to a detection enabling signal source, a source terminal electrically coupled to a ground, and a drain terminal electrically coupled to the second terminal of the voltage divider detection monitoring circuit, configured to turn on a detection mode when the gate of the switching device receives a detection enabling signal.

8. The electromigration wearout detection circuit of claim 7, wherein the output of a k-th voltage comparator is 1 when a voltage Vk at the input terminal of the k-th voltage comparator is less than the output voltage VEM of the voltage detection circuit, the output of the k-th voltage comparator is 0 when the voltage Vk at the input terminal of the k-th voltage comparator is greater than the output voltage VEM of the voltage detection circuit, and the resistance of the detection element is calculated by a formula:

$$\frac{R\_EM}{R\_REF} = \frac{m}{N-m},$$

where m is a total number of voltage comparators that have an output with a value of one, and N is a total number of voltage comparators.

9. The electromigration wearout detection circuit of claim 1, wherein the electromigration wearout detection monitoring circuit comprises a voltage controlled oscillator (VCO) electromigration wearout detection monitoring circuit having:

a voltage detection circuit comprising the detection element having a first terminal and a second terminal, and the reference element having a first terminal and a second terminal, wherein the first terminal of the detection element forms a high voltage VH of the voltage detection circuit, the second terminal of the detection element is electrically coupled to the first terminal of the reference element to form an output voltage VEM of the voltage detection circuit, and the second terminal of the reference element forms a low voltage VL of the voltage detection circuit;

a first VCO voltage detection circuit having an input terminal electrically coupled to the high voltage VH of the voltage detection circuit to measure the high voltage VH of the voltage detection circuit;

a second VCO voltage detection circuit having an input terminal electrically coupled to the output voltage VEM of the voltage detection circuit to measure the output voltage VEM of the voltage detection circuit;

a third VCO voltage detection circuit having an input terminal electrically coupled to the low voltage VL of the voltage detection circuit to measure the low voltage VL of the voltage detection circuit; and a switching device having a gate terminal electrically coupled to a detection enabling signal source, a source terminal electrically coupled to a ground, and a drain terminal electrically coupled to a second terminal of the voltage divider detection monitoring circuit, configured to turn on a detection mode when the gate of the switching device receives a detection enabling signal.

10. The electromigration wearout detection circuit of claim 9, wherein the resistance of the detection element is calculated by a formula:

$$\frac{R\_EM}{R\_REF} = \frac{VH - VEM}{VEM - VL}$$

where R_EM is the resistance of the detection element, and R_REF is the resistance of the reference element.

11. A method of electromigration wearout detection comprising:

embedding a detection element intrinsically in a hot circuit portion of an integrated circuit, and a reference element, wherein the detection element is subject to normal operation current, and the reference element is not subject to normal operation current, switchable via a switching device and a detection enabling signal;

measuring, periodically, a resistance of the detection element using an electromigration wearout detection monitoring circuit;

calculating a resistance change of the detection element over a predetermined time period;

comparing the resistance change of the detection element calculated to a predetermined safety threshold; and taking one or more mitigation actions when the resistance change of the detection element exceeds the predetermined safety threshold.

12. The method of claim 11, wherein the detection element comprises:
a metal wire;
a via; and
a combination thereof.

13. The method of claim 11, wherein the reference element comprises:
a metal wire;
a via;
a resistor; and
a combination thereof.

14. The method of claim 11, wherein one or more mitigation actions comprise:
switching to a redundant circuit of the integrated circuit;
shutting down the integrated circuit; and
sending a signal in order to initiate a system service call.

15. The method of claim 11, wherein the predetermined safety threshold is 1% of the resistance change of the detection element.

16. A method of electromigration wearout detection comprising:

embedding a detection element extrinsically in close proximity of a hot circuit portion of an integrated circuit, and a reference element, wherein the detection element is subject to normal operation current, and the reference element is not subject to normal operation current, switchable via a switching device and a detection enabling signal;

measuring, periodically, a resistance of the detection element using an electromigration wearout detection monitoring circuit;

calculating a resistance change of the detection element over a predetermined time period;

comparing the resistance change of the detection element calculated to a predetermined safety threshold; and taking one or more mitigation actions when the resistance change of the detection element exceeds the predetermined safety threshold.

17. The method of claim 16, wherein the detection element comprises:
a metal wire;
a via; and
a combination thereof.

18. The method of claim 16, wherein the reference element comprises:
a metal wire;
a via;
a resistor; and
a combination thereof.

19. The method of claim 16, wherein one or more mitigation actions comprise:
switching to a redundant circuit of the integrated circuit;
shutting down the integrated circuit; and
sending a signal in order to initiate a system service call.

20. The method of claim 16, wherein the predetermined safety threshold is 1% of the resistance change of the detection element.

* * * * *